(12) United States Patent
An

(10) Patent No.: US 8,646,405 B2
(45) Date of Patent: Feb. 11, 2014

(54) DEPOSITION MASK AND METHOD OF FABRICATING THE SAME

(75) Inventor: Chi-Wook An, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 353 days.

(21) Appl. No.: 12/860,096

(22) Filed: Aug. 20, 2010

(65) Prior Publication Data

US 2011/0041758 A1    Feb. 24, 2011

(30) Foreign Application Priority Data

Aug. 21, 2009    (KR) .................. 10-2009-0077606

(51) Int. Cl.
*B05C 11/00*    (2006.01)
*C23C 16/00*    (2006.01)

(52) U.S. Cl.
USPC ..................... 118/504; 118/720; 118/715

(58) Field of Classification Search
None
See application file for complete search history.

(56) References Cited

U.S. PATENT DOCUMENTS

| | | | | |
|---|---|---|---|---|
| 7,405,879 B2 * | 7/2008 | Wild et al. | ..................... | 359/566 |
| 7,563,147 B2 * | 7/2009 | Sakai et al. | ..................... | 445/24 |
| 7,612,932 B2 * | 11/2009 | Chui et al. | ..................... | 359/290 |
| 7,816,860 B2 * | 10/2010 | Kobayashi | ..................... | 313/504 |
| 7,851,989 B2 * | 12/2010 | Noda | ..................... | 313/503 |
| 7,982,385 B2 * | 7/2011 | Kimura et al. | ..................... | 313/503 |
| 8,040,052 B2 * | 10/2011 | Kobayashi | ..................... | 313/506 |
| 2005/0237780 A1 * | 10/2005 | Sakai | ..................... | 365/111 |
| 2006/0012280 A1 * | 1/2006 | Kang et al. | ..................... | 313/310 |

FOREIGN PATENT DOCUMENTS

| | | |
|---|---|---|
| JP | 2001-052854 | 2/2001 |
| JP | 2004-327373 | 11/2004 |
| JP | 2005-197010 | 7/2005 |
| JP | 2005-197011 | 7/2005 |
| JP | 2005-298971 A | 10/2005 |
| JP | 2008-091323 | 4/2008 |

OTHER PUBLICATIONS

Korean Office Action dated Apr. 12, 2011 for Korean Patent Application No. KR 10-2009-0077606 which corresponds to the captioned application.

* cited by examiner

*Primary Examiner* — Dah-Wei Yuan
*Assistant Examiner* — Jethro Pence
(74) *Attorney, Agent, or Firm* — Knobbe Martens Olson & Bear LLP

(57) ABSTRACT

A deposition mask capable of forming layers with different thicknesses and a method of fabricating the same are disclosed. In one embodiment, the deposition mask includes i) a plurality of regions spaced apart from each other, wherein the plurality of regions comprise at least a first region and a second region and ii) first and second surfaces opposing each other, wherein the first surface is configured to receive a deposition material. Also, a through-hole is defined in each of the plurality of regions, and wherein at least one of the through-holes in the first surface of the mask is divided into a plurality of sub-regions. Further, the number of a sub-region or sub-regions of the first region is different from that of the second region.

8 Claims, 4 Drawing Sheets

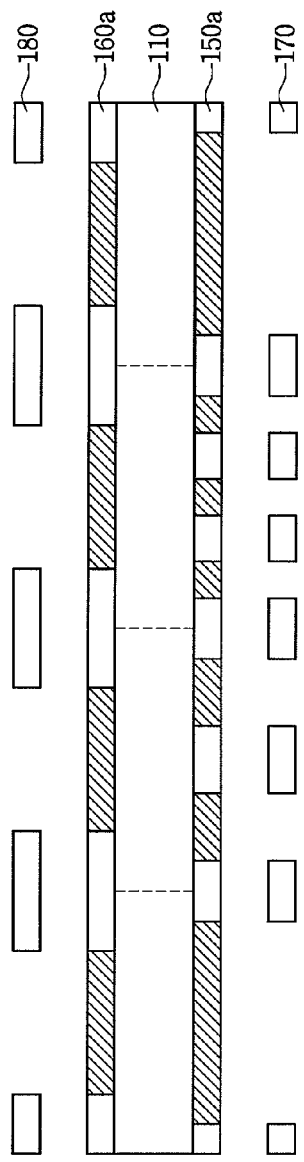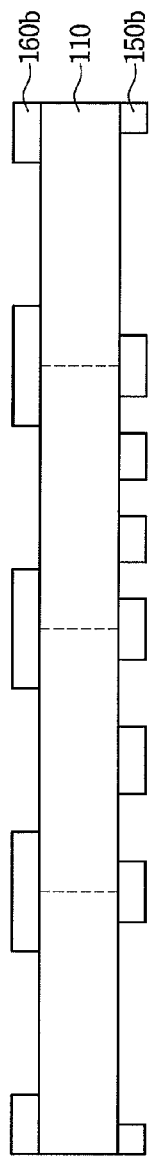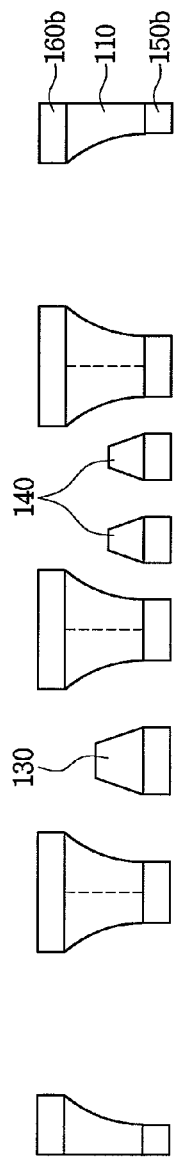

DEPOSITION MASK AND METHOD OF FABRICATING THE SAME

CROSS-REFERENCE TO RELATED APPLICATION

This application claims the benefit of Korean Patent Application No. 2009-77606, filed Aug. 21, 2009, the disclosure of which is hereby incorporated herein by reference in its entirety.

BACKGROUND OF THE INVENTION

1. Field of the Invention

The present invention relates to a deposition mask capable of forming layers with different thicknesses and a method of fabricating the same.

2. Description of the Related Technology

In general, an organic light emitting diode (OLED) may include i) an anode, a cathode and an organic layer interposed between the anode and the cathode. The anode layer may be a transparent electrode formed of, for example, indium tin oxide (ITO). The cathode may be formed of a metal having a small work function, such as calcium (Ca), lithium (Li), or aluminum (Al). When a forward voltage is applied to the OLED, holes emitted from the anode may combine with electrons emitted from the cathode to produce excitons, which recombine to emit light, thus causing an electroluminescence phenomenon.

The anode may be embodied as a reflection electrode to reflect light, while the cathode may be embodied as a transmissive type to transmit light, thereby completing fabrication of the OLED in which light can be emitted from the organic layer toward the cathode.

SUMMARY OF CERTAIN INVENTIVE ASPECTS

One aspect of the present invention is a deposition mask capable of forming layers with different thicknesses and a method of fabricating the same.

Another aspect of the present invention is a deposition mask which includes a first region and a second region. Each of the first and second regions has a hole, and a bottom surface of the hole of the first region has a different number of divided regions from a bottom surface of the hole of the second region.

The bottom surface of the hole of the first region may have a single region, while the bottom surface of the hole of the second region may have two divided regions.

The bottom surface of the hole of the first region may have a single region, while the bottom surface of the hole of the second region may have three divided regions.

The bottom surface of the hole of the first region may have two divided regions, while the bottom surface of the hole of the second region may have three divided regions.

Another aspect of the present invention is a deposition mask which includes a first region and a second region. Each of the first and second regions has a hole, at least one of a bottom surface of the hole of the first region and a bottom surface of the hole of the second region has a subsidiary slit, and the bottom surface of the hole of the first region has a different number of subsidiary slits from the bottom surface of the hole of the second region.

The hole of the first region may have no subsidiary slit, and the hole of the second region may have a single subsidiary slit.

The hole of the first region may have no subsidiary slit, and the hole of the second region may have two subsidiary slits.

The hole of the first region may have a single subsidiary slit, and the hole of the second region, may have two subsidiary slits.

The hole of a bottom surface of the deposition mask may have a greater area than the hole of a top surface thereof.

The hole of the top surface of the deposition mask may have a predetermined sectional tilt angle of less than 90°.

The first and second regions may be repetitively arranged in a stripe or matrix shape.

Another aspect of the present invention is a method of fabricating a deposition mask including a first region and a second region, which includes: coating a first photoresist material on a bottom surface of the deposition mask and coating a second photoresist material on a top surface of the deposition mask; disposing first and second photomasks having predetermined patterns on the first and second photoresist materials, respectively; exposing and developing the first and second photoresist materials using the first and second photomasks as masks, respectively, to form a predetermined pattern layer; and etching the deposition mask as the predetermined pattern layer as an etch mask to form holes in the first and second regions, respectively.

A bottom surface of the hole formed in the first region may have a different number of divided regions from a bottom surface of the hole formed in the second region At least one of a bottom surface of the hole formed in the first region and a bottom surface of the hole formed in the second region may include a subsidiary slit, and the bottom surface of the hole formed in the first region may have a different number of subsidiary slits from the bottom surface of the hole formed in the second region. Another aspect of the invention is a deposition mask comprising: a plurality of regions spaced apart from each other, wherein the plurality of regions comprise at least a first region and a second region; and first and second surfaces opposing each other, wherein the first surface is configured to receive a deposition material, wherein a through-hole is defined in each of the plurality of regions, and wherein at least one of the through-holes in the first surface of the mask is divided into a plurality of sub-regions, and wherein the number of a sub-region or sub-regions of the first region is different from that of the second region.

In the above mask, the through-hole of the first region is not divided so that the first region has no sub-region, wherein the through-hole of the second region in the first surface of the mask is divided into two sub-regions, and wherein the widths of the two sub-regions are substantially similar to each other. In the above mask, the plurality of regions comprise a third region, wherein the through-hole of the third region in the first surface of the mask is divided into three sub-regions, and wherein the widths of the three sub-regions are substantially similar to each other.

In the above mask, the through-hole of the first region is not divided so that the first region has no sub-region, wherein the through-hole of the second region in the first surface of the mask is divided into three sub-regions, and wherein the widths of the three sub-regions are substantially similar to each other. In the above mask, the through-hole of the first region in the first surface of the mask is divided into two sub-regions, and wherein the through-hole of the second region in the first surface of the mask is divided into three sub-regions.

In the above mask, the width of at least one of the through-holes is greater in the first surface than in the second surface. In the above mask, the at least one through-hole has a predetermined sectional tilt angle of less than about 90° in the first surface. In the above mask, the first region and the second region are repetitively arranged in a stripe or matrix shape.

Another aspect of the invention is a deposition mask comprising: a plurality of regions spaced apart from each other, wherein the plurality of regions comprise at least a first region and a second region; and first and second surfaces opposing each other, wherein the first surface is configured to receive a deposition material, wherein a through-hole is defined in each of the plurality of regions, and wherein at least one of the regions comprises at least one dividing member which is configured to divide the respective region into a plurality of sub-regions, and wherein the number of a dividing member or dividing members of the first region is different from that of the second region.

In the above mask, the first region does not comprise a dividing member, wherein the second region comprises a single dividing member which is configured to divide the second region into two sub-regions, and wherein the widths of the two sub-regions are substantially similar to each other. In the above mask, the plurality of regions comprise a third region, wherein the third region comprises two dividing members which are configured to divide the third region into three sub-regions, and wherein the widths of the three sub-regions are substantially similar to each other. In the above mask, the first region does not comprise a dividing member, wherein the second region comprises two dividing members which are configured to divide the second region into three sub-regions, and wherein the widths of the three sub-regions are substantially similar to each other. In the above mask, the first region comprises a single dividing member which is configured to divide the first region into two sub-regions, and wherein the second region comprises two dividing members which are configured to divide the second region into three sub-regions.

In the above mask, the width of at least one of the through-holes is greater in the first surface than in the second surface. In the above mask, the at least one through-hole has a predetermined sectional tilt angle of less than about 90°. In the above mask, the first and second regions are repetitively arranged in a stripe or matrix shape.

Another aspect of the invention is a method of fabricating a deposition mask including a first region and a second region, the method comprising: providing a plate member to be fabricated to a deposition mask, wherein the plate member comprises first and second surfaces opposing each other, and wherein the first surface is configured to receive a deposition material; coating a first photoresist material on the first surface of the plate member and coating a second photoresist material on the second surface of the plate member; disposing first and second photomasks having predetermined patterns on the first and second photoresist materials, respectively; exposing and developing the first and second photoresist materials using the first and second photomasks as masks, respectively, to form a predetermined pattern layer; and etching the plate member as the predetermined pattern layer as an etch mask to form holes in the first and second regions, respectively, so as to fabricate a deposition mask.

In the above method, at least one of the first and second regions is divided into a plurality of sub-regions, and wherein the number of a sub-region or sub-regions of the first region is different from that of the second region. In the above method, at least one of the first and second regions comprises a dividing member which is configured to divide the respective region into a plurality of sub-regions, and wherein the number of a dividing member or dividing members of the first region is different from that of the second region. The above method further comprises forming a third region in the plate member, wherein a through-hole is defined in the third region, wherein the third region comprises two dividing members which are configured to divide the third region into three sub-regions, and wherein the widths of the three sub-regions are substantially similar to each other.

BRIEF DESCRIPTION OF THE DRAWINGS

FIGS. 5A through 5C are cross-sectional views illustrating a process of fabricating a deposition mask according to an exemplary embodiment of the present invention.

DETAILED DESCRIPTION OF CERTAIN INVENTIVE EMBODIMENTS

An organic layer may be formed using various methods. One of the various methods is a deposition method. When an OLED display device is fabricated using the deposition method, a mask having the same pattern as a target thin layer may be closely adhered to a target plane where the target thin layer will be formed. Further, a material of the target thin layer may be deposited, thereby forming the target thin layer having a predetermined pattern.

Figure 1:
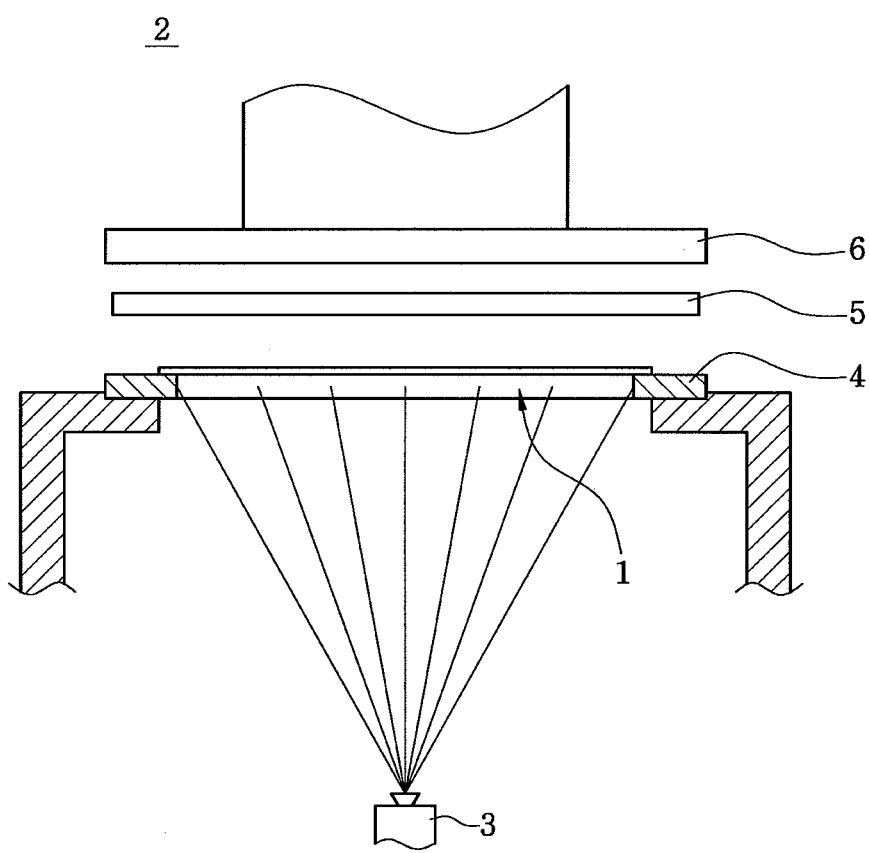
FIG. 1 is a cross-sectional view of a deposition apparatus including a deposition mask.

FIG. 1 is a cross-sectional view of a deposition apparatus including a deposition mask. Referring to FIG. 1, in order to deposit a thin layer (e.g., an organic layer including an emission layer) of an OLED display device using a mask 1, a frame 4 combined with the mask 1 may be installed in a position corresponding to a crucible 3 installed in a vacuum chamber 2. Further, a target object 5 on which the thin layer will be formed may be mounted over the frame 4. A magnet unit 6 may be installed over the target object 5 and driven to closely adhere the mask 1 supported by the frame 4 to the target object 5 on which the thin layer will be formed. Thereafter, the crucible 3 may be driven so that a material contained in the crucible 3 can be deposited on the target object 5.

Meanwhile, in order to embody a full-color display function, the OLED display device may be fabricated to include OLEDs having red (R), green (G), and blue (B) emission layers. In this case, the OLED display device may employ a resonance structure to maximize luminous efficiency. Therefore, the R, G, and B emission layers may be respectively formed to optimum thicknesses so as to maximize a constructive effect of light according to the wavelength of light.

Figure 2:
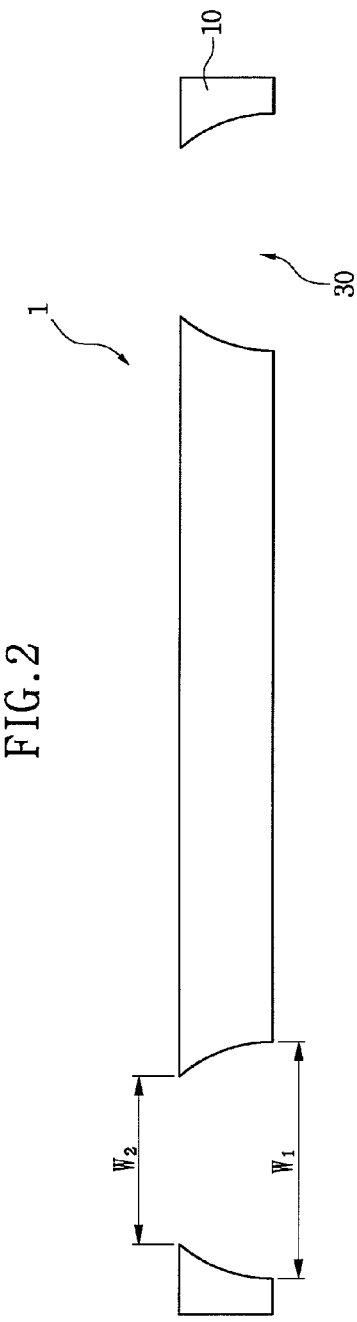
FIG. 2 is a cross-sectional view of a mask.

FIG. 2 is a cross-sectional view of a mask. Referring to FIG. 2, a mask 1 may have a hole 30 corresponding to the shape of one (e.g., an R emission layer) of R, G, and B emission layers. Thus, a deposition material may be deposited on a substrate through the hole 30, thereby forming the R emission layer. Thereafter, the G emission layer may be formed using an additional mask other than the mask 1 used for forming the R emission layer, and the B emission layer may be formed using another mask.

In this case, the hole 30 may be formed to have different areas in top and bottom surfaces of the mask 1, respectively.

Thus, a width W2 of the hole 30 in the top surface of the mask 1 may differ from a width W1 of the hole 30 in the bottom surface thereof.

That is, since the R, G, and B emission layers are formed to optimum thicknesses to maximize the light construction effect as described above, the R, G, and B emission layers may be formed to different thicknesses. Since the R, G, and B emission layers with different thicknesses cannot be formed using a single mask, respective masks for forming the R, G, and B emission layers may be required. As a result, not only the number of fabrication processes but also fabrication costs may be increased, thereby hindering the mass production of OLED display devices.

Embodiments of the present invention will be described more fully hereinafter with reference to the accompanying drawings, in which exemplary embodiments of the invention are shown.

In the drawings, the thicknesses of layers and regions may be exaggerated for clarity. It will also be understood that when a layer is referred to as being "on" another layer or substrate, it can be directly on the other layer or substrate or intervening layers may also be present. Like numbers refer to like elements throughout.

Figure 3:
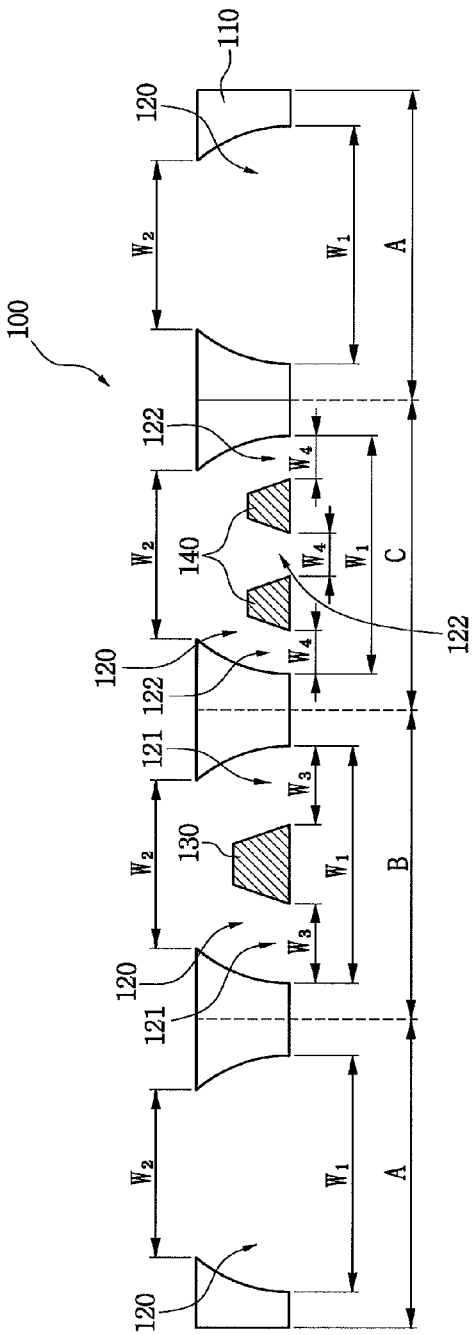
FIG. 3 is a cross-sectional view of a deposition mask according to an exemplary embodiment of the present invention.

FIG. 3 is a cross-sectional view of a deposition mask according to an exemplary embodiment of the present invention.

Referring to FIG. 3, a deposition mask 100 according to an exemplary embodiment of the present invention may be divided into regions A, B, and C, each of which has a hole (or a through-hole) 120 to deposit layers with different thicknesses. The regions A, B, and C may be repetitively arranged in a stripe or matrix shape.

In this case, the hole 120 may be formed to have different areas in top and bottom surfaces of the mask 100. In one embodiment, the bottom surface of the mask 100 receives a deposition material. A width W2 of the hole 120 formed in the top surface of the mask 100 may differ from a width W1 of the hole 120 formed in the bottom surface thereof such that the hole 120 formed in the mask 100 may be greater in the bottom surface of the mask 100 than in the top surface thereof. Thus, the hole 120 formed in the top surface of the mask 100 may have a predetermined sectional tilt angle θ.

In this case, the sectional tilt angle θ of the hole 120 formed in the top surface of the mask 100 may be less than about 90°. When the sectional tilt angle θ of the hole 120 formed in the top surface of the mask 100 is about 90° or more, a shadow effect may not occur in an edge portion of the hole 120 formed in the top surface of the mask 100 as will be described later.

Also, the hole 120 formed in the bottom surface of the region A of the mask 100 may have a single region, the hole 120 formed in the bottom surface of the region B of the mask 100 may be divided into two regions (or two sub-regions) 121, and the hole 120 formed in the bottom surface of the region C of the mask 100 may be divided into three regions (or three sub-regions) 122.

That is, the hole 120 formed in the bottom surface of the region A of the mask 100 may be formed as the single region to have different areas in the top and bottom surfaces of the mask 100, respectively. Thus, the width W2 of the hole 120 formed in the top surface of the mask 100 may differ from the width W1 of the hole 120 formed in the bottom surface thereof.

Also, the hole 120 formed in the bottom surface of the region B of the mask 100 may be divided into the two regions 121 so that the width W2 of the hole 120 formed in the top surface of the mask 100 may differ from a width W3 of each of the regions 121 disposed in the bottom surface thereof. In one embodiment, the widths W3 of the sub-regions 121 may be substantially similar to each other.

In addition, the hole 120 formed in the bottom surface of the region C of the mask 100 may be divided into the three regions 122 so that the width W2 of the hole 120 formed in the top surface of the mask 100 may differ from a width W4 of each of the regions 122 disposed in the bottom surface thereof. In one embodiment, the widths W4 of the sub-regions 122 may be substantially similar to each other.

In this case, since a single subsidiary slit (or a dividing member) 130 is provided in the bottom surface of the mask 100, the hole 120 formed in the bottom surface of the mask 100 may be divided into the two regions 121. Also, since two subsidiary slits (or dividing members) 140 are provided in the bottom surface of the mask 100, the hole 120 formed in the bottom surface of the mask 100 may be divided into the three regions 122.

In other words, the hole 120 formed in the bottom surface of the region A of the mask 100 may have a single region without a subsidiary slit, and the hole 120 formed in the bottom surface of the region B of the mask 100 may be divided into the two regions 121 by the single subsidiary slit 130. Also, the hole 120 formed in the bottom surface of the region C of the mask 100 may be divided into the three regions 122 by the two subsidiary slits 140.

In one embodiment, the width W2 of the hole 120 formed in the top surface of the mask 100 may differ from the width W1 of the hole 120 formed in the bottom surface of the mask 100 so that the hole 120 formed in the top surface of each of the regions A, B, and C has a sectional tilt angle θ of less than about 90°. In this embodiment, the hole 120 formed in the bottom surface of the mask 100 has a greater area than the hole 120 formed in the top surface thereof. Meanwhile, the number of the divided regions of the hole 120 formed in the bottom surface of the mask 100 may be varied according to the absence or presence of the subsidiary slit.

Although FIG. 3 illustrates that the mask 100 is divided into the regions A, B, and C that are arranged repetitively, the mask 100 may be divided into two or four or more regions A and B that are arranged repetitively.

In addition, although FIG. 3 illustrates that the hole 120 has one, two, and three regions in the regions A, B, and C, respectively, the number of divided regions may be increased or decreased according to a desired deposition thickness. In this case, the number of the divided regions may be controlled using the subsidiary slits 140.

Furthermore, although FIG. 3 illustrates that the hole 120 formed in the bottom surface of the mask 100 is divided into a plurality of regions using the subsidiary slits 140, the subsidiary slits 140 may not completely divide the hole 120 formed in the bottom surface of the mask 100 but function only as shielding layers to connect the plurality of regions with one another.

Figure 4A:
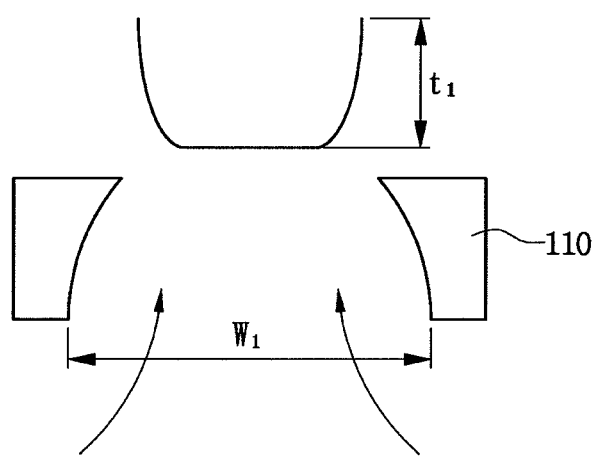
FIGS. 4A and 4B are cross-sectional views illustrating a process of depositing layers with different thicknesses using a deposition mask according to an exemplary embodiment of the present invention.
Figure 4B:
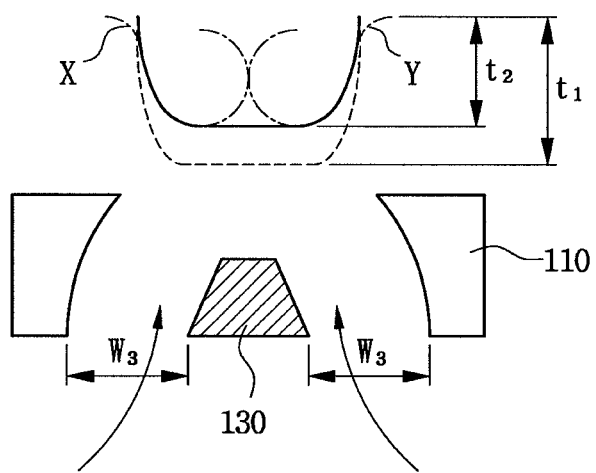

FIGS. 4A and 4B are cross-sectional views illustrating a process of depositing layers with different thicknesses using a deposition mask according to an exemplary embodiment of the present invention.

Referring to FIG. 4A, which corresponds to the region A of the mask 100 of FIG. 3, no subsidiary slit may be provided in a bottom surface of a mask so that a hole can have a single region.

As shown in FIG. 4A, a deposition material may evaporate from the bottom surface of the mask in the direction indicated by arrows so that a desired pattern may be deposited to a thickness t1.

A section of the hole formed in a top surface of the mask may have a tilt angle of less than about 90°. Thus, a shadow effect may occur in an edge portion of the hole formed in the top surface of the mask so that an edge portion of the pattern may have a nonuniform thickness and shape.

Referring to FIG. 4B, which corresponds to the region B of the mask 100 of FIG. 3, one subsidiary slit 130 may be provided in a bottom surface of the mask so that a hole can be divided into two regions.

As shown in FIG. 4B, a deposition material may evaporate from the bottom surface of the mask in the direction indicated by arrows so that a desired pattern may be deposited to a thickness t2.

If the subsidiary slit 130 was not provided, the desired pattern would be deposited to the thickness t1. However, in the region of FIG. 4B, a shadow effect may occur in each of edge portions of the two regions divided by the subsidiary slit 130 so that wave forms X and Y can be obtained by the respective regions. Thus, the waveforms X and Y may constructively or destructively interfere with each other, thereby forming a pattern having a thickness t2.

Therefore, the holes formed in the bottom surface of the deposition mask according to the exemplary embodiment may include different numbers of regions divided by different numbers of subsidiary slits so that the mask may be used to form layers having different thicknesses.

Also, by forming layers having different thicknesses using one mask, the number of masks and the number of mask processes may be reduced to improve the mass production of OLEDs.

FIGS. 5A through 5C are cross-sectional views illustrating a process of fabricating a deposition mask according to an exemplary embodiment of the present invention.

Referring to FIG. 5A, a first photoresist material 150a may be coated on a bottom surface of a mask 110, and a second photoresist material 160a may be coated on a top surface thereof. The mask 110 may be a plate member formed of a metal material.

Also, photomasks 170 and 180 having predetermined patterns may be formed on the first and second photoresist materials 150a and 160a, respectively. The patterns of the photomasks 170 and 180 may be formed to correspond to widths W1 through W4 of FIG. 3.

The first and second photoresist materials 150a and 160a may be photosensitive polymers whose molecular bindings are changed in response to reception of light of specific wavelength ranges. The photosensitive polymers may include a positive photoresist material and a negative photoresist material. When exposed to light of specific wavelength ranges, polymer chains of an exposed portion of the positive photoresist material may be cut, while polymer chains of an exposed portion of the negative photoresist material may be bound more tightly. The first and second photoresist materials 150a and 160a according to the present exemplary embodiment may be positive materials.

As shown in FIG. 5A, the first and second photoresist materials 150a and 160a may be exposed using the photomasks 170 and 180, respectively.

Referring to FIG. 5B, the first and second photoresist materials 150a and 160a may be developed using a predetermined developing solution, thereby forming predetermined pattern layers 150b and 160b.

Meanwhile, an exposed portion of a positive photoresist material may melt in the developing solution, while an unexposed portion of a negative photoresist material may melt in the developing solution.

Since the first and second photoresist materials 150a and 160a according to the present exemplary embodiment are positive photoresist materials as described above, exposed portions of the first and second photoresist materials 150a and 160a may melt in the developing solution, thereby forming a structure of FIG. 5B.

Referring to FIG. 5C, a mask 110 may be etched by means of an etchant using the predetermined pattern layers 150b and 160b as an etch mask so that holes 120 may be formed in top and bottom surfaces of the mask 110 as shown in FIG. 3.

Subsequently, although not shown, the predetermined pattern layers 150b and 160b may be removed from the mask 110, thereby completing fabrication of a deposition mask according to the exemplary embodiment of the present invention.

As described above, exemplary embodiments of the present invention provide a deposition mask capable of forming layers with different thicknesses.

Furthermore, layers having different thicknesses may be formed using a single mask, thereby reducing the number of masks and the number of mask processes to improve the mass production of display devices.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A deposition mask comprising:
a plurality of regions spaced apart from each other, wherein the plurality of regions comprise at least a first region and a second region; and
first and second surfaces opposing each other, wherein the first surface is configured to receive a deposition material,
wherein a through-hole is defined in each of the plurality of regions, and wherein at least one of the through-holes in the first surface of the mask is divided into a plurality of sub-regions,
and wherein the quantity of sub-regions of the first region is different from that of the second region and the width of the sub-regions of the first region is different from the width of the sub-regions of the second region, wherein the through-hole of the first region in the first surface of the mask is divided into two sub-regions, and wherein the through-hole of the second region in the first surface of the mask is divided into three sub-regions.

2. The mask of claim 1, wherein the width of at least one of the through-holes is greater in the first surface than in the second surface.

3. The mask of claim 2, wherein the at least one through-hole has a predetermined sectional tilt angle of less than about 90° in the first surface.

4. The mask of claim 1, wherein the first region and the second region are repetitively arranged in a stripe or matrix shape.

5. A deposition mask comprising:
a plurality of regions spaced apart from each other, wherein the plurality of regions comprise at least a first region and a second region; and
first and second surfaces opposing each other, wherein the first surface is configured to receive a deposition material,
wherein a through-hole is defined in each of the plurality of regions, and wherein at least one of the regions comprises at least one dividing member which is configured to divide the respective region into a plurality of sub-regions, and wherein the quantity of dividing members of the first region is different from that of the second region and the width of the sub-regions of the first region is different from that of the sub-regions of the second region, wherein the first region comprises a single dividing member which is configured to divide the first region into two sub-regions, and wherein the second region comprises two dividing members which are configured to divide the second region into three sub-regions.

6. The mask of claim 5, wherein the width of at least one of the through-holes is greater in the first surface than in the second surface.

7. The mask of claim 6, wherein the at least one through-hole has a predetermined sectional tilt angle of less than about 90°.

8. The mask of claim 5, wherein the first and second regions are repetitively arranged in a stripe or matrix shape.

* * * * *